United States Patent [19]
Monte

[11] Patent Number: 5,768,462
[45] Date of Patent: Jun. 16, 1998

[54] GROOVED OPTICAL FIBER FOR USE WITH AN ELECTRODE AND A METHOD FOR MAKING SAME

[75] Inventor: Thomas D. Monte, Lockport, Ill.

[73] Assignee: KVH Industries, Inc., Orland Park, Ill.

[21] Appl. No.: 611,172

[22] Filed: Mar. 5, 1996

[51] Int. Cl.$^6$ .................................................. G02B 6/02
[52] U.S. Cl. ........................ 385/123; 385/40; 385/8; 385/129
[58] Field of Search ................... 385/123–129, 385/2, 8, 11, 40, 147

[56] References Cited

U.S. PATENT DOCUMENTS

| | | | |
|---|---|---|---|
| 5,182,783 | 1/1993 | Bosc et al. | 385/123 |
| 5,437,000 | 7/1995 | Dyott | 385/137 |
| 5,442,719 | 8/1995 | Chang et al. | 385/3 |
| 5,617,499 | 4/1997 | Brueck et al. | 385/123 X |

FOREIGN PATENT DOCUMENTS

| | | | |
|---|---|---|---|
| 0 015 533 | 9/1980 | European Pat. Off. | G02B 5/16 |
| 90 08970 | 8/1990 | WIPO | G02F 1/01 |

OTHER PUBLICATIONS

Patent Abstracts of Japan, vol. 014 No. 462, Oct. 5, 1990, *Sumitomo Electric Ind Ltd.*, Jul. 17, 1990.

X. Long, R.A. Myers and S.R.J. Brueck, "Measurement of linear electro–optic effect in temperature/electric–field poled optical fibres," Elect. Letts. 8, Dec. 1994, vol. 30, No. 25, pp. 2162–2163.

P.G. Kazansky, L. Dong and P. St. J. Russel, "Vacuum poling: an improved technique for effective thermal poling of silica glass and germanosilicate optical fibers," Elect. Letts. 4 Aug. 1994, vol. 30, No. 16, pp. 1345–1347.

P.G. Kazansky et al., "Glass fiber poling and applications," Paper SuC1, OSA Topical Meeting on Photosensitivity and Quadratic Nonlinearity in Glass Waveguides: Fendamentals and Applications, Sep. 11–14, 1995.

S.R.J. Brueck, "Perspectives in glass poling," Paper SaA3, OSA Topical Meeting on Photosensitvity and Wuadratic Nonlinearity in Glass Waveguides: Fundamentals and Applications, Sep. 11–14, 1995.

T. Fujiwara et al, "U.V. Excited Poling and Electronically Tunable Bragg Gratings in a Germanosilicate Fiber," OFC 95 Post Deadline Paper, Mar. 3, 1995.

T. Fujiwara et al, "Electro–optic modulation in hermanosilicate fibre with UV–excited poling," Elect. letts. 30 Mar. 1995, vol. 31, No. 7, pp. 573–575.

S.C. Fleming, T. Fujiwara and D. Wong, "UV–excited poling of germanosilicate fiber," Paper SuD1, OSA Topical Meeting on Photosensitivity and Quadratic Nonlinearity in Glass Waveguides: Fundamentals and Applications, Sep. 11–14–1995.

T. Fujiwara et al., "Large electroplic modulation in a thermally–poled gemanosilicate fiber,"IEEE Photonics Technology Letters, vol. 7, No. 10, Oct., 1995, pp. 1177–1179.

P.G. Kaszansky, et al., "Optical Fibre electrets: Observation of electro–acousto–optic transduction," Electronics Letters, vol. 30, No. 17, pp. 1436–1438 Aug. 1994.

*Primary Examiner*—Phan T. H. Palmer

[57] ABSTRACT

An optical fiber which modifies the optical signals propagated through the fiber and has refractive properties which change in response to electromagnetic energy. The outer surface of the fiber forms at least one groove extending along a selected length of the fiber for receiving an electrode, which would apply an electrical voltage to the fiber resulting in a change of the refractive properties of the fiber.

57 Claims, 6 Drawing Sheets

5,768,462

GROOVED OPTICAL FIBER FOR USE WITH AN ELECTRODE AND A METHOD FOR MAKING SAME

FIELD OF INVENTION

The present invention relates generally to the field of fiber optics, and, in particular to a grooved optical fiber for use in modulators, switches, or other electro-optic devices.

BACKGROUND

Fiber optics is generally concerned with the transmission of light along a transparent fiber structure with a higher refractive index than its surroundings. Using optical fiber equipment in communications systems has several advantages over the use of conventional electronic equipment. For example, optical fiber transmission equipment is compact, lightweight, and potentially inexpensive compared with conventional equipment. Also, transmission over optical fibers does not generate interference and is unaffected by external interference, as compared with conventional equipment.

A typical fiber used in fiber optics consists of core, cladding, and outer protective layer. The core and the cladding have different indices of refraction and together form a guiding region for an optical signal. The difference in refractive indices enables properly directed light to be internally reflected at the core-cladding boundary. Thus, the optical signals will be guided down the core and will not be lost into the cladding. The outer protective layer is used to increase mechanical strength of the fiber and allow the fiber to be more easily manipulated.

All-fiber active devices, such as modulators or switches, could not be constructed using silica-based materials because silica-based devices do not have a second-order non-linearity term in their electric displacement equation. This term is responsible for the change in index of refraction in the fiber due to an applied electric field (the electro-optic effect). However, it has been recently discovered that poling the fiber thermally, with ultra-violet (UV) radiation, or using other methods generates the second-order non-linearity term. Thus, it is now possible to construct all-fiber active devices, such as modulators, from silica-based materials.

Poling can be accomplished a number of ways. In thermal poling, the fiber is heated to a desired temperature, typically 250 to 300 degrees Celsius, and an electric field is simultaneously applied. The fiber is allowed to cool with the electric field still applied. On the other hand, in UV poling, the silica is subjected to a high electric field while being irradiated with a strong source of UV radiation. Both types of poling usually require the silica to be doped with impurities, such as Germanium for the core and Fluorine for the cladding, to increase the electro-optic effect in the fiber to levels needed for the device to function properly. It is also possibly to attain the same result by heavily doping one region while lightly doping (or not doping) the other region.

One example of an active device is a phase modulator. Phase modulators were previously constructed as integrated optical waveguides using lithium niobate. Lithium niobate is a material used extensively in the art for the construction of integrated optical chips. All-fiber modulators can be used anywhere lithium niobate integrated optical waveguide modulators are used. All-fiber devices could replace lithium niobate integrated chips used in high bandwidth optical modulators in CATV and telecommunication systems and sensors, such as, but not limited to closed loop gyroscopes. Other applications could include remote high voltage sensing in the power industry.

Typically, an all-fiber phase modulator is constructed with a fiber having electrodes which apply a voltage across the fiber to change its refractive properties. By applying a voltage, the phase of a signal propagating through the fiber is changed and phase modulation occurs. In order to produce a sufficient electric field in the guiding region both during poling and also for subsequent application of a voltage to the fiber, it is preferred that the electrodes be as close as possible to the fiber core.

One method in the prior art of bringing the electrodes closer to the core consists of polishing an area of the fiber. One poled fiber modulator 10 of this type is shown in FIG. 1. Here, one surface 11 of the fiber is polished, and an electrode 14 is placed on the polished surface near the guiding region. A piece of fused silica 12 is placed on the non-polished fiber surface 13. Another electrode 15 is then placed on the silica 12 to form a modulator 10. FIG. 2 shows another fiber of the prior art which uses polishing. Here, a fiber modulator 20 consists of a fiber 21 with two sides 22 and 23 of the fiber 21 polished and the electrodes 24 and 25 attached on the opposing polished sides 22 and 23.

Another method of bringing electrodes close to the core consists of drilling holes into the fiber and inserting electrodes into these holes. A fiber 30 of this type is shown in FIG. 3. Here, two holes 31 and 32 are formed in the fiber allowing the electrodes to be placed close to the core 33 in the holes 31 and 32.

The prior art, though adequate in some respects, has several shortcomings. For example, the fibers of FIG. 1 and FIG. 2, require polishing. Polishing a fiber is a difficult and costly process because the polishing accuracy must be high due to the small size of the fiber. This is especially difficult and costly for long fiber distances. Therefore, a need exists for a fiber for use in a fiber modulator that does not require costly polishing yet still brings the electrodes sufficiently close to the core for the modulator to function properly.

Additionally, fibers of the type shown in FIG. 3 require electrodes to be inserted into the fiber. Coupling the fiber to other fibers is difficult because the electrodes must exit the fiber, preventing direct butt coupling or fusion splicing to interfacing fibers. Therefore, a need exists for a fiber where the electrodes can be pulled away and do not interfere with the splicing or coupling region.

Also, in fibers of the type illustrated in FIG. 3, it is very difficult to push the fragile electrode wires into the end of the fiber. The cost and time of manufacturing is a significant drawback because of the difficulty of electrode insertion. Thus, a need exists for a fiber which facilitates the positioning of the electrodes.

Furthermore, accurate polishing of a fiber or the insertion fragile wires cannot easily be accomplished over long distances. The cost and time of manufacturing is a significant drawback in the construction of long distance fibers because of the difficulty of electrode insertion over long distances. Therefore, a need exists for a fiber where the electrodes can be reliably and economically placed over long fiber distances.

SUMMARY OF THE INVENTION

It is an object of the invention to provide a fiber for use in electro-optical devices, such as fiber modulators, that does not require polishing yet brings the electrodes close enough to the core for the modulator to function properly.

Another object of the invention is to provide a fiber where the electrodes can be pulled away from the fiber without interfering with the splicing or coupling of the fiber.

A further object of the invention is to provide a fiber which facilitates the positioning of the electrodes.

Still another object of the invention is to provide a fiber where electrodes can be reliably placed over long fiber distances.

Still another object of the invention is to provide a fiber that simple to manufacture at a low cost.

Other aspects and advantages of the present invention may become apparent upon reading the following detailed description and upon reference to the drawings.

In accordance with the present invention, the foregoing objectives are realized by an optical fiber which modifies the optical signals propagated through the fiber and has refractive properties which change in response to electromagnetic energy. The outer surface of the fiber forms at least one groove extending along a selected length of the fiber for receiving an electrode, which would apply an electrical voltage to the fiber resulting in a change of the refractive properties of the fiber.

DESCRIPTION OF THE PREFERRED EMBODIMENTS

Several illustrative embodiments of a grooved fiber optical cable and its use as a modulator are described below as they might be implemented to provide for improved electro-optic devices. In the interest of clarity, not all features of an actual implementation are described in this specification. It will of course be appreciated that in the development of any such actual implementation (as in any development project), numerous implementation-specific decisions must be made to achieve the developers' specific goals and subgoals, such as compliance with system- and business-related constraints, which will vary from one implementation to another. Moreover, it will be appreciated that such a development effort might be complex and time-consuming, but would nevertheless be a routine undertaking of device engineering for those of ordinary skill having the benefit of this disclosure.

Figure 4A:
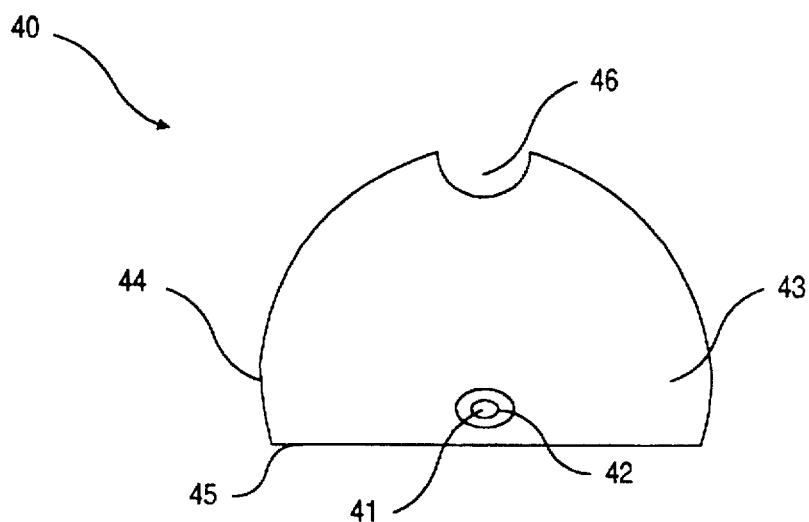
FIG. 4a is a cross-sectional view of a grooved-fiber according to the principles of the invention.

FIG. 4a shows a cross-sectional view of one embodiment of the present invention. As shown, a fiber 40 includes a core 41, a cladding, 42, and an outer protective layer 43. The fiber has two surfaces: a rounded surface 44 and a flat surface 45, and is referred to as a D-shaped fiber. This shape is advantageous because it allows easy coupling of the fiber to other optical devices and optical fibers.

The D-shaped fiber 40 is constructed so that the polarization of signals moving through it is maintained. To maintain the polarization of a signal in an optical fiber, the optical properties of the fiber must be anisotropic, or in other words a function of the angle of polarization with respect to the fiber. One method of making the optical fiber anisotropic is to construct the core with a non-circular cross-section defining two transverse orthogonal axes permitting the de-coupling of waves polarized along those axes. Signals which are launched into such fibers in alignment with one of the transverse axes tend to remain aligned with that axes as the signals are propagated through the fiber, thereby preserving the polarization of the signal.

The core 41 of the guiding region of the optical fiber has a non-circular cross section which defines two transverse orthogonal axes for holding the polarization of signals aligned along those axes. The dimensions of the core 41 and the cladding 42 comprise a guiding region. Because of the elliptical shape, this guiding region will also hold the polarization of optical signals propagated therethrough in alignment with either axis of the ellipse. That is, the major and minor axes of the elliptical cross section represent two transverse orthogonal axes which permit the de-coupling of waves along those axes.

In accordance with aspects of the present invention, an optical fiber 40 is provided which modifies optical signals propagated through the fiber 40. The fiber 40 has refractive properties which change in response to electromagnetic energy. The core 41 and cladding 42 have different indices of refraction surrounding a longitudinal axis of the fiber 40 and form the guiding region. In this particular embodiment, the fiber is poled and the core 41 and cladding 42 doped with impurities. Moreover, the core 41 has a relatively high index of refraction surrounded by the cladding 42 with a lower index of refraction.

The guiding region is sufficiently close to a groove 46 to allow for a change in the refractive properties of the guiding region when a voltage is applied across the guiding region. The core 41 has an elliptical cross section defining major and minor transverse orthogonal axes. The major axis has a longer transverse direction than the minor axis for guiding the optical signals. The difference in the core dimensions between the axes and the difference between the refractive indices of the core 41 and the cladding 42 are sufficiently large to maintain the polarization of the optical signal. A support layer 43 surrounds the core 41 and cladding 42. In this particular embodiment, the groove 46 is aligned with the minor axis of the elliptical core 41 and extends along a selected length of the fiber 40.

The guiding region of the D-shaped fiber is preferably offset or displaced from the geometric center (i.e. centroid of mass or center of gravity of the transverse section) toward the flat surface 45. Preferably, the guiding region is located within a few average core diameters of the flat surface 45 so that the outer surface of a portion of the fiber may be etched to expose the guiding region at the surface. For example, the guiding region can be located within about three average core diameters of the flat surface 45. The outer surface of the fiber has a predetermined geometric relationship to the guiding region.

In one particular example, fibers with 85 micron outer diameters were created with a grooves varying from 14.5 to 22.5 microns in depth. The grooves did not penetrate to the core. The distance from the center of the waveguide core to the bottom of the groove was 30 microns for all of the fibers.

Figure 4B:
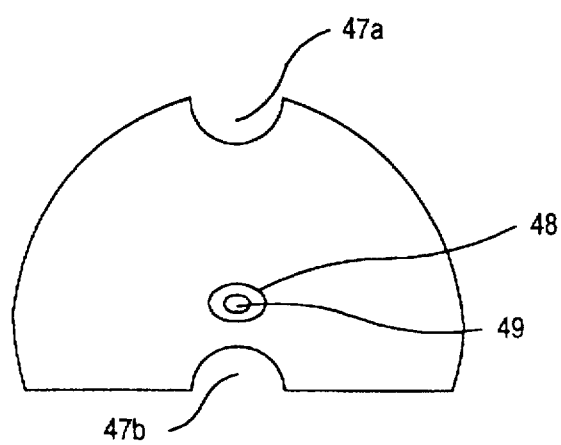
FIG. 4b is a cross-sectional view of a dual grooved-fiber according to the principles of the invention.

FIG. 4b shows a cross-sectional view of an alternative D-shaped fiber. The D-shaped fiber includes two opposing grooves 47a and 47b. The guiding region of the fiber is offset further away from the flat surface as compared with the guiding region of FIG. 4a ensuring sufficient space for groove 47b. Other configurations for the fiber (D-shaped or not) are possible with the present invention as would be understood by one of skill in the art.

Figure 5:
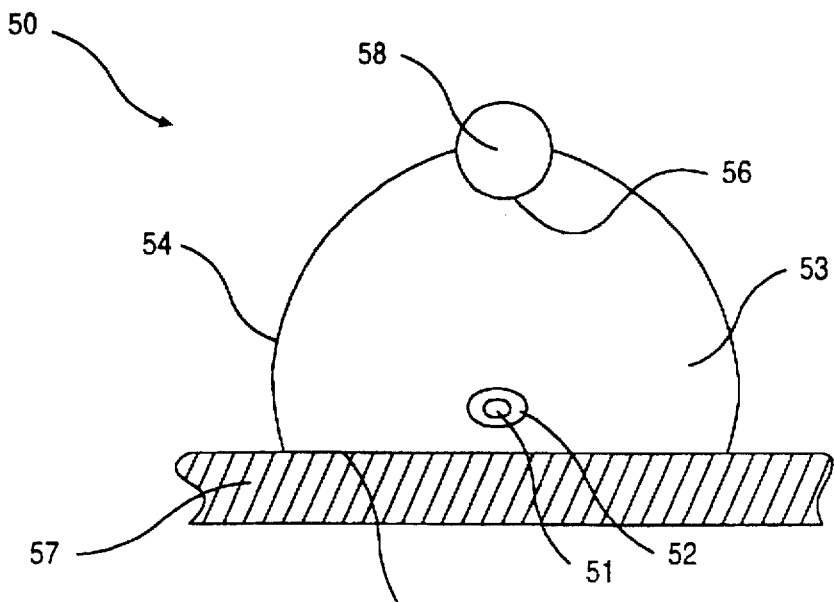
FIG. 5 is a cross-sectional view of a phase modulator according to the principles of the invention.

FIG. 5 shows a cross-sectional view of an all-fiber phase modulator constructed using the grooved D-fiber of FIG. 4a and generally indicated by 50. The modulator 50 which modifies optical signals propagated through the modulator 50 includes a core 51, cladding 52, outer protective layer 53, rounded surface 54 and flat surface 55. These features of the D-fiber were discussed with regard to FIG. 4a.

In addition to the features listed above, the fiber phase modulator contains an anode 57 and a cathode 58. The cathode 58 can be easily laid into groove 56, and in this particular embodiment it is of sufficient size so that the fit is snug. The ends of the electrodes can be attached in a number of different ways, for example, using adhesive. The electrodes are preferably composed of gold wire, but other good conductors are adequate. Specifically, 25 micron gold wire has been used.

Using an all-fiber modulator has an advantage that the modulator can be fusion spliced into the optical system without the need for adhesives or solders. This is a great advantage over existing lithium niobate technology. The all-fiber modulators can also be used in tunable Bragg grating filters. If a D-fiber is used in the modulator, it is splicable to standard D-fibers.

As shown in FIGS. 4 and 5, polishing of the fiber is not necessary. Polishing of the fiber is not required since the electrodes can be close to the waveguide region. For longer fiber distances, this a difficult task. Thus, as a result of the present invention, all-fiber modulators with longer lengths are easier and less costly to assemble because the difficult and costly process of polishing fibers is avoided.

Figure 6:
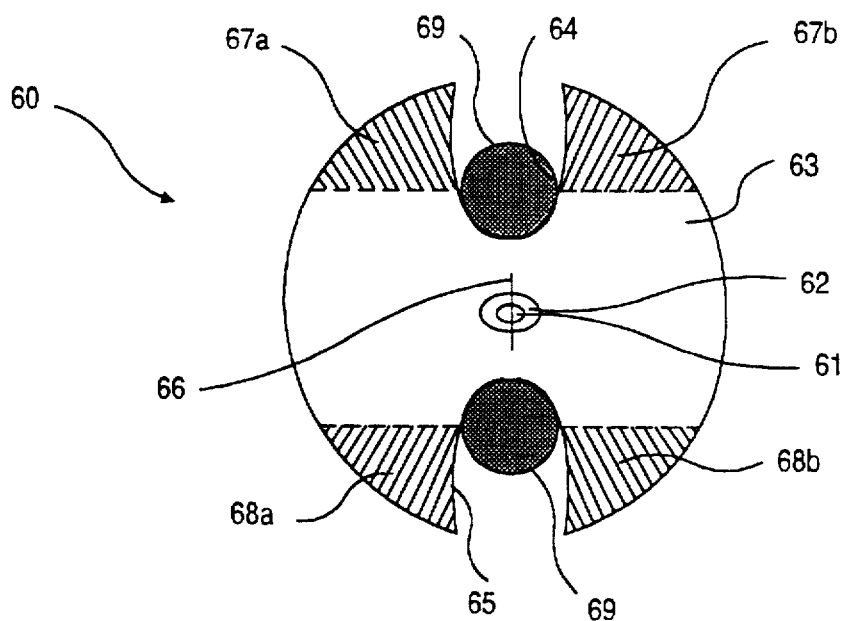
FIG. 6 is a cross-sectional view of a dual-grooved phase modulator according to the principles of the invention.

Still another embodiment of a phase modulator according to the principles of the present invention is illustrated in FIG. 6. Although the fiber shown is different in cross-sectional area, the description regarding the core and cladding of FIG. 4a is applicable. As shown, a dual-grooved fiber, generally indicated at 60, consists of a core 61, cladding 62, outer protective layer 63 and two grooves 64 and 65. The grooves are aligned with the minor axis 66 of the core 61 which is elliptical. The grooves 64 and 65 are also aligned so that they oppose each other.

Additionally, the fiber phase modulator contains two electrodes 69. Both can be easily laid into grooves 64 and 65 and are of sufficient size so that they fit snugly into the grooves 64 and 65. The ends of the electrodes 69 can be attached in a number of different ways, and the electrodes 69 are preferably composed of a good conductor. For example, 25 micron gold wire can be used.

As shown, the four upper portions of the fiber 67a, 67b, 68a, and 68b are optional. Whether these portions are retained depends on the specific application environment where the fiber is used.

As shown in FIG. 6, polishing of the fiber is not necessary. Polishing of the fiber is not required since the electrodes are already close to the waveguide region. Thus, all-fiber modulators with longer lengths are easier and less costly to assemble because the difficult and costly process of polishing fibers is avoided.

Pushing fragile wires into holes is also very difficult for longer distances. In the approach of the present invention, the electrode wires can be easily pushed into the grooves over much longer lengths that were previously possible. All-fiber modulators with longer lengths are therefore easier and less costly to assemble because the difficult and costly process of inserting wires into fibers is avoided.

Figure 1:
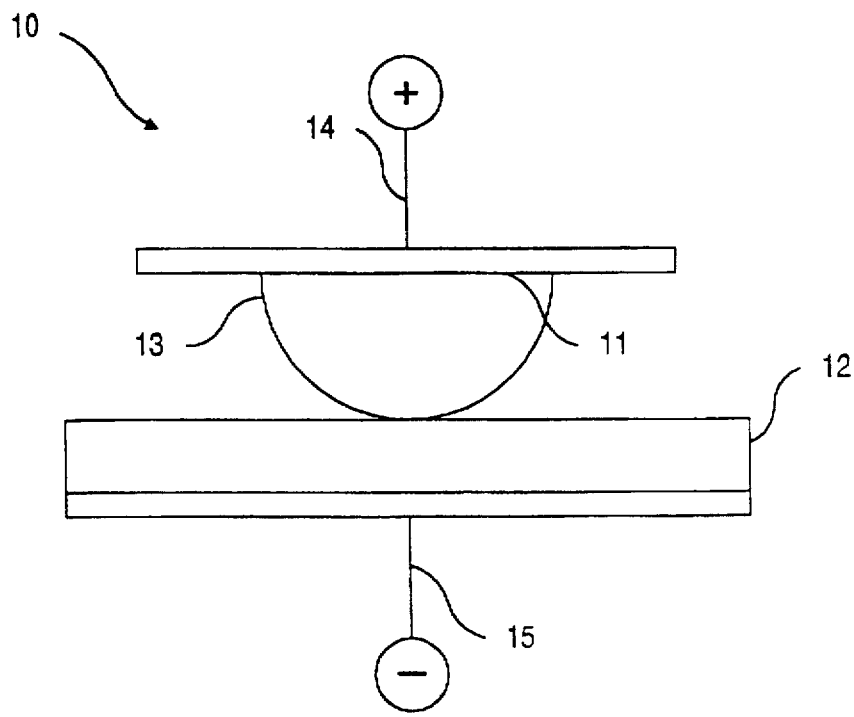
FIG. 1 shows a cross-sectional side view of a phase modulator of the prior art using a D-shaped polarization-holding fiber.
Figure 2:
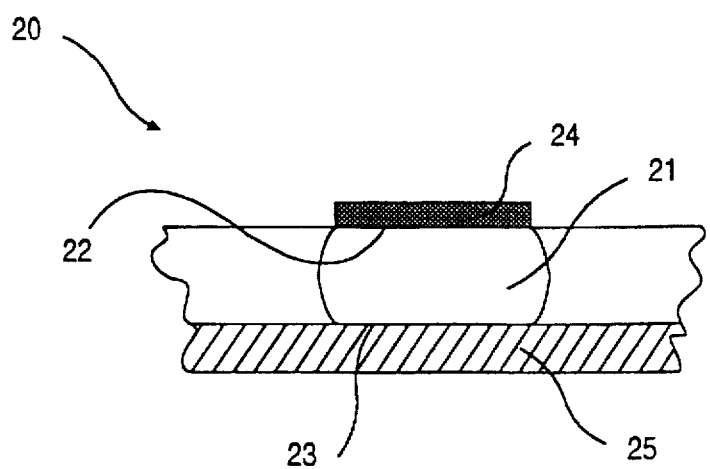
FIG. 2 shows a cross-sectional side view of another prior art modulator using a polished fiber.
Figure 3:
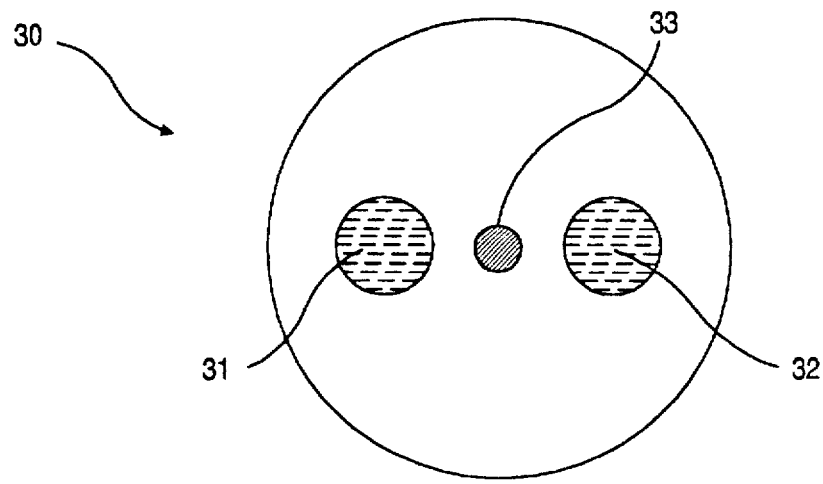
FIG. 3 shows a cross-sectional view of a prior art two-hole fiber for use in a phase modulator.

Furthermore, in the twin hole approach of FIG. 3, coupling to the fibers is inhibited by the electrodes because the electrode wire must exit at the holes. This prevents direct butt coupling or fusion splicing to interfacing fibers. With the approach of FIG. 6, the electrodes are easily pulled away and do not interfere near the splicing or coupling region. The grooved D fiber is splicable to other standard D fibers as well as circular fibers.

Figure 7:
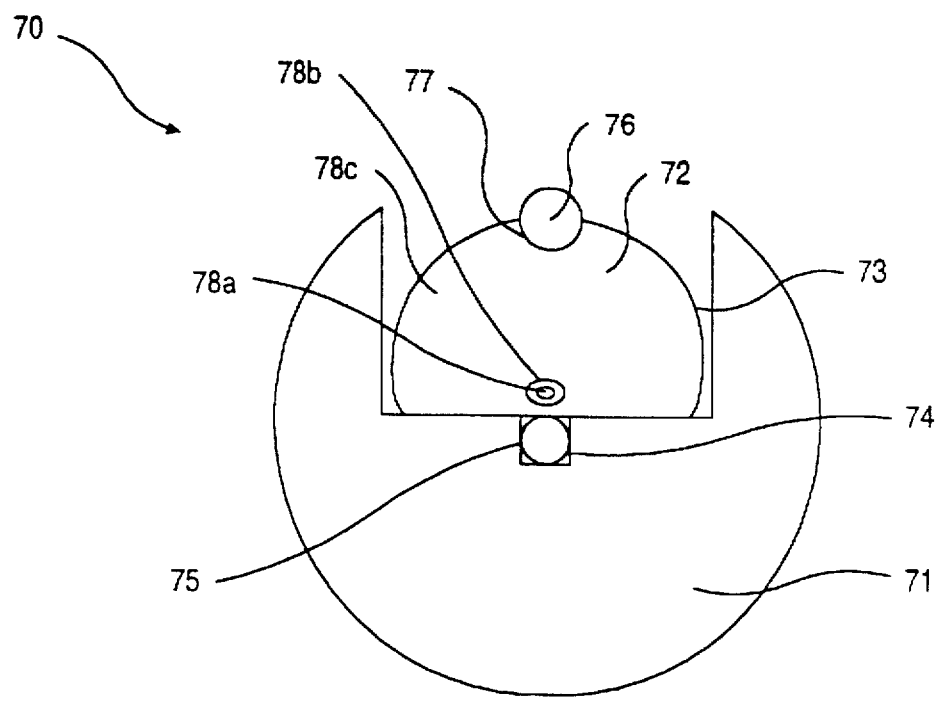
FIG. 7 is a cross-sectional view of an optical fiber assembly according to the principles of the invention.

FIG. 7 shows an optical fiber assembly, generally indicated at 70, with an optical fiber according to the principles of the present invention. As shown, a chuck 71 holds a D-type fiber 72 of the type illustrated in FIG. 4a in a chuck groove 73. An inner groove 74 is within the chuck groove 73 and is used to place an anode electrode 75. The fiber chuck 71 is a rod, preferably made out of silica-based glass or other materials. Ideally, a glass rod is machined to remove sectors of the glass, forming a fiber chuck preform. The preform is then into a fiber chuck 71 of the same cross-sectional shape as the preform but on a smaller scale.

The cathode electrode 76 is placed in the fiber groove 77 of the D-type fiber 72. The fiber 72 is a D-shaped fiber as discussed for FIG. 4a. In this particular embodiment, the groove 77 is aligned with the minor axis of the elliptical core 78a and extends along a selected length of the fiber.

As shown in FIG. 7, no polishing of the fiber is required. The grooves on both the fiber and the chuck allow easy placement of the electrodes during manufacturing. This allows assembly to be easier and less costly than previously realized.

The electro-optic effect of poled silica has been shown to be polarization dependent. That is, when the polarization of the applied electric field is aligned with the polarization of the optical signal, the electro-optic effect is maximized. In a D-shaped fiber, the major axis of the core ellipse is often parallel to the flat of the D. If the light polarization is aligned parallel to the flat, the optical energy is confined in the odd $HE_{11}$ mode. On the other hand, if the light is aligned perpendicular to the flat of the D, the optical energy is confined in the even $HE_{11}$ mode. In situations where mode confinement is critical, it is preferable to operate in the odd $HE_{11}$ mode with the core ellipse parallel to the flat of the D-shaped fiber. However, with the groove in a position opposite the flat of the D, the polarization of the electric poling field would not be aligned with the polarization of the optical signal.

Figure 8:
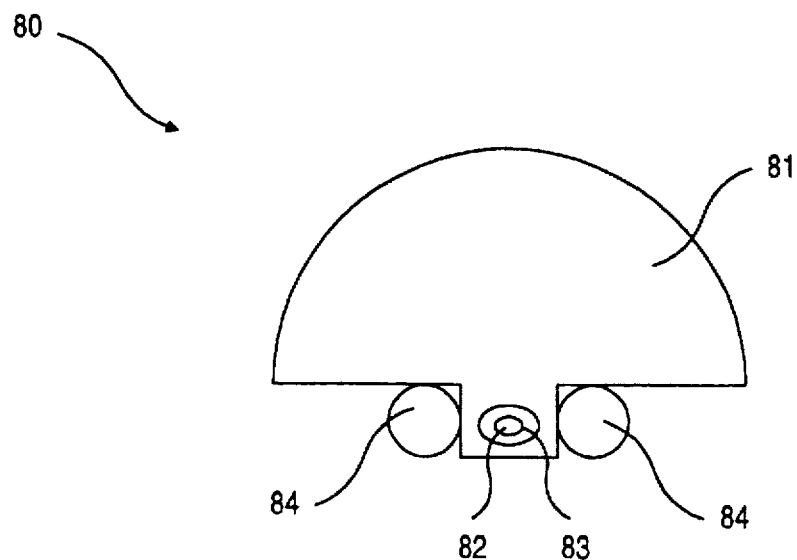
FIG. 8 is a cross-sectional view of an optical fiber assembly according to the principles of the invention.

FIG. 8 shows an optical fiber assembly, generally indicated at 80, with an optical fiber according to the principles of the present invention. As shown, a D-shaped fiber 81 with core 82 and cladding 83 has two electrodes 84 placed about the core 82 and cladding 83.

The polarization of the electric poling field of the optical fiber assembly of FIG. 8 is aligned with the optical polarization because of the placement of the electrodes in relation to the core 82. Furthermore, no polishing of the fiber is required. Additionally, in the twin hole approach of FIG. 3, coupling to the fibers is inhibited by the electrodes because the electrode wire must exit at the holes. This prevents direct butt coupling or fusion splicing to interfacing fibers. With the approach of FIG. 8, the electrodes are easily pulled away and do not interfere near the splicing or coupling region. This grooved D fiber is splicable to other standard D fibers as well as circular fibers.

Figure 9:
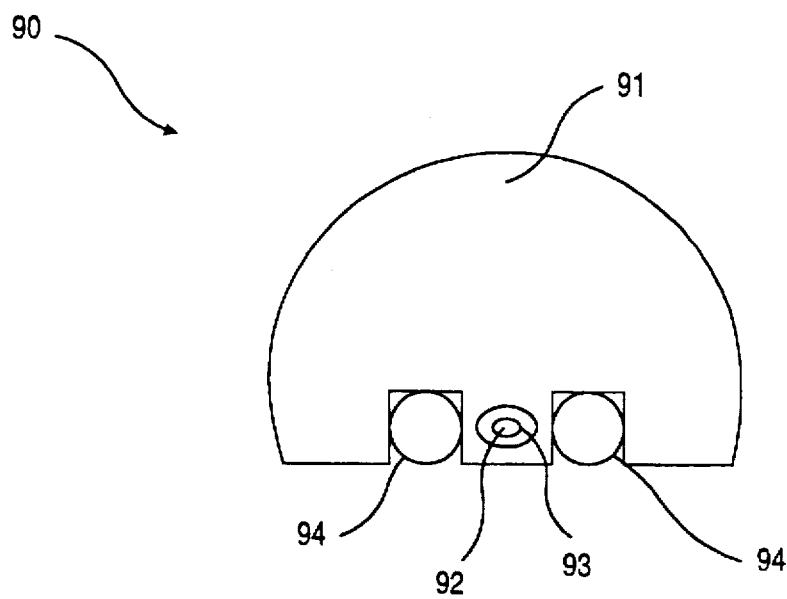
FIG. 9 is a cross-sectional view of an optical fiber assembly according to the principles of the invention.

FIG. 9 shows an optical fiber assembly, generally indicated at 90, with an optical fiber according to the principles of the present invention. As shown, a D-shaped fiber 91 with core 92 and cladding 93 has two electrodes 94 placed about the core 92 and cladding 93.

The polarization of the electric poling field of the optical fiber assembly of FIG. 9 is aligned with the optical polarization because of the placement of the electrodes in relation to the core 92. Furthermore, no polishing of the fiber is required. Additionally, in the twin hole approach of FIG. 3, coupling to the fibers is inhibited by the electrodes because the electrode wire must exit at the holes. This prevents direct butt coupling or fusion splicing to interfacing fibers. With the approach of FIG. 9, the electrodes are easily pulled away and do not interfere near the splicing or coupling region. This grooved D fiber is splicable to other standard D fibers as well as circular fibers.

In accordance with another important aspect of the invention, the optical fiber is made by forming a preform having a doped core and cladding forming a guiding region which is offset from the center of the preform and has a non-circular cross section defining two transverse orthogonal axes.

A groove is machined into the preform. The depth of the groove and the cross-sectional shape of the preform is chosen such that when the preform is drawn out, the groove will be of the proper shape but on a smaller scale. After the configuration for the preform is obtained, the preform is then drawn by a drawing machine.

Figure 10:
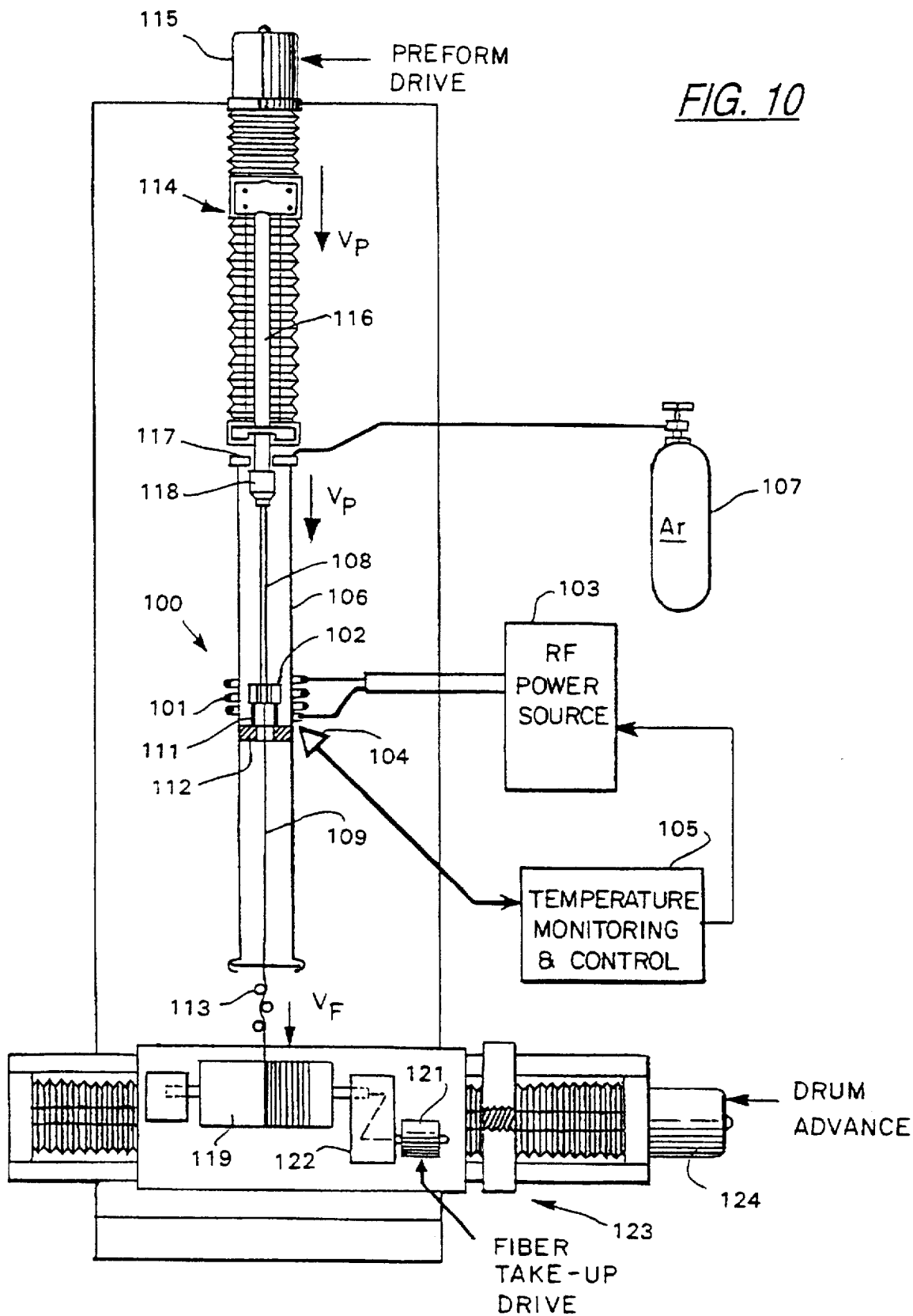
FIG. 10 is a partially schematic side elevation of apparatus for drawing optical fiber according to the invention.

FIG. 10 shows a drawing machine suitable for this purpose. In order to heat the preform to approximately the softening temperature, the central component of the drawing machine is an induction furnace generally designated 100 comprising an external induction coil 101 and an internal graphite toroid 102. The induction coil 101 is energized by a radio-frequency power source 103 so that the electrical heating currents are induced in the graphite toroid 102, the resulting temperature being measured by an optical pyrometer 104 and monitored by a control unit 105 adjusting the power source 103. In order to prevent the graphite toroid 102 from burning, the toroid 102 is disposed within a glass cylinder 106 which is filled with a relatively inert gas such as argon from supply 107.

The preform 108 is fed from the top of the cylinder 106 and passes through the center of the graphite toroid 102. The toroid 102 is heated white hot causing the preform 108 to soften. The drawing of the fiber 109 from the preform 108 occurs approximately at the center of the toroid 102. The toroid 102 has legs 111 which stand on a support ring 112 attached to the glass cylinder 106.

The critical parameters affecting the drawing process are the rate of feed $V_p$ of the preform 108 toward the drawing point, the temperature at the drawing point, and the rate $V_f$ at which the fiber 109 is drawn from the drawing point. The temperature and rate of drawing $V_f$ set the tension at which the fiber 109 is drawn, and this tension may be further regulated by a series of tension-rollers 113 which also assure that the fiber 109 is drawn coaxially out of the bottom of the glass cylinder 106. The rate of feed of the preform $V_p$ is established by a vertical linear slide generally designated 114 having a lead screw driven by a drive motor 115. A vertical shaft 116 is actuated by the slide 114 and extends into the glass cylinder 116 through a gas seal 117. At the end of the shaft 116 is a Phillips chuck 118 which grips the top end portion of the preform 108. The rate of drawing $V_f$ on the other hand, is established by a horizontal take-up drum 119 below the lower end of the glass cylinder 106. The take-up drum 119 is journaled for rotation and driven by a take-up motor 121 through a speed reduction gear assembly 122. To wind the fiber 113 in a helical fashion on the take-up drum 119, the drum as well as the take-up drive itself is mounted on a horizontal linear slide generally designated 123 having a lead screw driven by a drum advance motor 124.

The fiber is then poled. Due to the high cost of UV poling, the preferred method of poling is thermal poling. As discussed above, in thermal poling, the fiber is heated to a desired temperature with an electric field applied. Using one method, the electric field used during poling is applied using the electrodes attached to the fiber through the groove. The fiber is then allowed to cool with the field still applied. The fiber can be rolled into spools and removed from the spools in any desired length at a later date. At that time, the electrodes can be added and the fiber spliced to other fibers. For example, the fiber can be cut for use in one branch of a Mach-Zehnder interferometric waveguide modulator.

The process has a advantage of producing grooved fibers that do not require polishing. Polishing away the fiber or pushing fragile wires into holes as the prior art is difficult for longer distances. Accurate polishing of a fiber over a long distance is also difficult. In the approach of the present invention, the electrode wires can be pushed into the grooves over much longer lengths that were previously possible. All-fiber modulators with longer lengths are therefore easier to assemble.

Thus, the invention provides an improved optical fiber. Those skilled in the art will readily recognize that these and various other modifications and changes may be made to the present invention without strictly following the exemplary application illustrated and described herein and without departing from the true spirit and scope of the present invention, which is set forth in the following claims.

I claim:

1. An optical fiber for modifying optical signals propagated through the fiber, the outer surface of said fiber forming at least one groove extending along a selected length of said fiber, an electrode which placed in said groove, for applying an electrical voltage to said fiber, said fiber having refractive properties which change in response to said voltage.

2. The optical fiber of claim 1 wherein said fiber comprises a core and cladding with different refractive indices surrounding a longitudinal axis.

3. The optical fiber of claim 2 wherein said core and cladding form a guiding region, said core having a non-circular cross section defining two transverse orthogonal axes, said core having a longer transverse dimension along one of said axes than along the other of said axes.

4. The optical fiber of claim 3, wherein said core has an elliptical transverse cross section, said cross section having a major and minor axis.

5. The optical fiber of claim 4 which includes a support layer surrounding said guiding region.

6. The optical fiber of claim 5 wherein said optical fiber has a circular transverse cross section.

7. The optical fiber of claim 6 where the outer surface of said fiber forms two grooves on opposing sides, said grooves aligned with the minor axis of said core.

8. The optical fiber of claim 5 wherein said optical fiber has a D-shaped cross section with a flat outer surface and a curved outer surface.

9. The optical fiber of claim 8 wherein said groove is along said flat surface.

10. The optical fiber of claim 8 wherein said groove is along said rounded surface.

11. The optical fiber of claim 5 wherein said optical fiber has two flat opposing outer surfaces and a groove along a selected length of each opposing surface.

12. The optical fiber of claim 3 wherein the difference in core dimensions along said orthogonal transverse axes and the difference between the refractive indices of said core and cladding are sufficiently large to maintain the polarization of said optical signals.

13. The optical fiber of claim 3 wherein said guiding region is located sufficiently close to said groove to allow for a sufficient change in said refractive properties of said guiding region by application of said voltage.

14. The optical fiber of claim 2 wherein said core and cladding are made of silica-based glass.

15. The optical fiber of claim 1 further comprising a second groove on said outer surface and opposing said groove.

16. The optical fiber of claim 1 wherein said fiber is poled.

17. An optical fiber for modifying optical signals propagated through the fiber, the outer surface of said fiber forming at least one groove extending along a selected length of said fiber, an electrode which placed in said groove for applying an electrical voltage to said fiber, said fiber having refractive properties which change in response to said voltage, said fiber forming a guiding region and having a generally circular transverse cross section.

18. The optical fiber of claim 17 wherein said fiber comprises a core and cladding having different refractive indices, said core having an elliptical transverse cross section.

19. The optical fiber of claim 18 which comprises two grooves on opposing sides, said grooves aligned with the minor axis of said elliptical core.

20. The optical fiber of claim 18 wherein the difference in core dimensions along said orthogonal transverse axes and the difference between the refractive indices of said core and cladding are sufficiently large to maintain the polarization of said optical signals.

21. The optical fiber of claim 17 wherein said guiding region is located sufficiently close to said groove to allow for a sufficient change in said refractive properties of said guiding region by application of said voltage.

22. An optical fiber for modifying optical signals propagated through the fiber, said fiber forming a guiding region, the outer surface of said fiber forming at least one groove extending along a selected length of said fiber, an electrode which placed in said groove, for applying a voltage to said fiber, said fiber having refractive properties which change in response to said voltage, and said fiber having a D-shaped transverse cross section with a flat outer surface and a curved outer surface.

23. The optical fiber of claim 22 wherein said fiber is composed of a core and cladding having different refractive indices.

24. The optical fiber of claim 23 wherein said core has a non-circular cross section defining two transverse orthogonal axes, said core having a longer transverse dimension along one of said axes than along the other of said axes.

25. The optical fiber of claim 24 wherein said cross section is elliptical.

26. The optical fiber of claim 24 wherein the difference in core dimensions along said orthogonal transverse axes and the difference between the refractive indices of said core and cladding are sufficiently large to maintain the polarization of said optical signals.

27. The optical fiber of claim 22 wherein said guiding region is located sufficiently close to said groove to allow for a sufficient change in said refractive properties of said guiding region by application of said voltage.

28. The optical fiber of claim 22 wherein said groove is along said flat surface.

29. The optical fiber of claim 22 wherein said groove is along said rounded surface.

30. An optical fiber for modifying optical signals propagated through the fiber, the outer surface of said fiber forming at least one groove extending along a selected length of said fiber, an electrode which places in said groove, for applying a voltage to said fiber, said fiber having refractive properties which change in response to said voltage, said fiber forming a guiding region and having a transverse cross section with two flat outer surfaces.

31. The optical fiber of claim 30 wherein said fiber is composed of a core and cladding having different refractive indices.

32. The optical fiber of claim 31 wherein said core has a non-circular cross section defining two transverse orthogonal axes, said core having a longer transverse dimension along one of said axes than along the other of said axes.

33. The optical fiber of claim 32 wherein the difference in core dimensions along said orthogonal transverse axes and the difference between the refractive indices of said core and cladding are sufficiently large to maintain the polarization of said optical signals.

34. The optical fiber of claim 30 wherein said guiding region is located sufficiently close to said grooves to allow for a sufficient change in said refractive properties of said guiding region by application of said voltage.

35. The optical fiber of claim 30 which has two grooves each along one of said opposing surfaces.

36. An optical fiber assembly for modifying optical signals propagated through the fiber, said fiber having a core and cladding with different refractive indices surrounding a longitudinal axis of said fiber, said fiber comprising:

a groove on an outer surface of said fiber extending along a selected length of said fiber, and an electrode for applying a voltage placed in said groove, said fiber having refractive characteristics which change in response said voltage on said electrode.

37. The optical fiber assembly of claim 35 further including a second electrode placed along a outer surface of said fiber.

38. The optical fiber assembly of claim 35 further including a second groove for placing a second electrode.

39. An optical fiber assembly for modifying optical signals propagated through the fiber, said fiber having a core and cladding with different refractive indices surrounding a longitudinal axis of said fiber and forming a guiding region, said core having a non-circular cross section defining two transverse orthogonal axes, said core having a longer transverse dimension along one of said orthogonal axes than along the other of said axes for guiding said optical signals, said fiber having a circular cross section, said fiber comprising:

a groove on an outer surface of said fiber extending along a selected length of said fiber, and an electrode for applying a voltage placed in said groove, said fiber having refractive characteristics which change in response to said voltage on said electrode.

40. The optical fiber assembly of claim 39 further including a second electrode placed along a outer surface of said fiber.

41. The optical fiber assembly of claim 39 further including a second groove for placing a second electrode.

42. The optical fiber of claim 39 wherein the difference in core dimensions along said orthogonal transverse axes and the difference between the refractive indices of said core and cladding are sufficiently large to maintain the polarization of said optical signals.

43. The optical fiber of claim 39 wherein said guiding region is located sufficiently close to said grooves to allow for a sufficient change in said refractive properties of said guiding region by application of said voltage.

44. An optical fiber assembly for modifying optical signals propagated through the fiber, said fiber having a core and cladding with different refractive indices surrounding a longitudinal axis of said fiber and forming a guiding region, said core having a non-circular cross section defining two transverse orthogonal axes, said core having a longer transverse dimension along one of said orthogonal axes than along the other of said axes for guiding said optical signals, said fiber having a D-shaped cross section with a flat surface and a rounded surface, said fiber comprising:

a groove on an outer surface of said fiber extending along a selected length of said fiber, and an electrode for applying a voltage placed in said groove, said fiber having refractive characteristics which change in response to said voltage on said electrode.

45. The optical fiber assembly of claim 44 wherein said groove is located along said flat surface.

46. The optical fiber assembly of claim 44 wherein said groove is located along said rounded surface.

47. An optical fiber assembly for modifying optical signals propagated through the fiber, said fiber having a core and cladding with different refractive indices surrounding a longitudinal axis of said fiber and forming a guiding region, said core having a non-circular cross section defining two transverse orthogonal axes, said core having a longer transverse dimension along one of said orthogonal axes than along the other of said axes for guiding said optical signals, said fiber having two flat surfaces, said fiber comprising:

a groove on an outer surface of said fiber extending along a selected length of said fiber, and an electrode for applying a voltage placed in said groove, said fiber having refractive characteristics which change in response to said voltage on said electrode.

48. The optical fiber of claim 47 wherein the difference in core dimensions along said orthogonal transverse axes and the difference between the refractive indices of said core and cladding are sufficiently large to maintain the polarization of said optical signals.

49. The optical fiber of claim 47 wherein said guiding region is located sufficiently close to said grooves to allow for a sufficient change in said refractive properties of said guiding region by application of said voltage.

50. An optical fiber phase modulator comprising:

an optical fiber having a core and cladding with different refractive indices surrounding a longitudinal axis of said fiber, said fiber having a fiber groove on an outer surface of said fiber extending along a selected length of said fiber, and said fiber having an electrode placed in said fiber groove, said fiber having refractive properties which change in response to electromagnetic energy on said electrode, and a fiber chuck, supporting said optical fiber with having a chuck groove along an outer surface of said fiber chuck.

51. The optical fiber phase modulator of claim 50 wherein said chuck groove contains an inner groove for placing an electrode.

52. The optical fiber phase modulator of claim 50 wherein said chuck and said fiber are made of silica-based glass.

53. A poled optical fiber for modifying optical signals propagated through the fiber having:

refractive properties which change in response to electromagnetic energy, a core and cladding with different refractive indices surrounding a longitudinal axis and forming a guiding region, said guiding region located sufficiently close to said groove to allow for a change in the refractive properties of said guiding region in response to said voltage, said core having an elliptical cross section defining a major and minor transverse orthogonal axes said major axis having a longer transverse dimension than said minor axis, for guiding said optical signals, the difference in core dimensions between said axes and the difference between the refractive indices of said core and cladding being sufficiently large to maintain the polarization of said optical signals, a support layer surrounding said core and cladding, a D-shaped cross section with a flat outer surface and a curved outer surface, a groove on said curved outer surface of said fiber, aligned with said minor axis of said elliptical core, said groove extending along a selected length of said fiber for placing an electrode, a first electrode placed in said groove, and a second electrode opposite said first electrode and on said flat outer surface.

54. A method for forming an optical fiber modulator, said method comprising the steps of:

providing an elongated preform having a desired cross-sectional area, forming at least one groove in an outer surface of said preform along a selected length of said preform, drawing said preform to form said optical fiber, poling said fiber, and placing an electrode in said groove.

55. A method for forming an optical fiber modulator, said fiber having an elliptical core with major a minor axes, said method comprising the steps of:

shaping an elongated preform to have a D-shaped cross-sectional area with a flat outer surface and a rounded outer surface, forming at least one groove in said rounded outer surface of said preform along a selected length of said preform, said groove aligned with said minor axis of said core, drawing said preform to form said optical fiber, poling said fiber by heating said fiber and applying an electromagnetic field to said fiber, and placing an electrode in said groove.

56. The method of claim 55 wherein said poling step is accomplished using ultra-violet radiation and an electric field.

57. The method of claim 55 wherein said poling step is accomplished using thermal energy and an electric field.

* * * * *